US006413696B1

(12) United States Patent
Pang et al.

(10) Patent No.: US 6,413,696 B1
(45) Date of Patent: Jul. 2, 2002

(54) LIQUID, RADIATION-CURABLE COMPOSITION, ESPECIALLY FOR PRODUCING CURED ARTICLES BY STEREOLITHOGRAPHY HAVING HEAT DEFLECTION TEMPERATURES

(75) Inventors: Thomas H. Pang, Castaic; Anastasios P. Melisaris, Stevenson Ranch; Wang Renyi, Alhambra; John W. Fong, Los Angeles, all of CA (US)

(73) Assignee: Vantico Inc., Brewster, NY (US)

( * ) Notice: Subject to any disclaimer, the term of this patent is extended or adjusted under 35 U.S.C. 154(b) by 0 days.

(21) Appl. No.: 09/602,172

(22) Filed: Jun. 22, 2000

Related U.S. Application Data

(62) Division of application No. 09/055,832, filed on Apr. 6, 1998, now Pat. No. 6,100,007.

(51) Int. Cl.$^7$ .......................... G03F 7/029; G03F 7/027
(52) U.S. Cl. .................... 430/280.1; 430/269; 522/92; 522/96; 522/90; 522/109; 522/142; 522/146; 522/170; 264/401
(58) Field of Search ................ 430/280.1, 269; 264/401; 522/92, 96, 90, 109, 142, 146, 170

(56) References Cited

U.S. PATENT DOCUMENTS

| | | | |
|---|---|---|---|
| 5,236,967 A | 8/1993 | Ohkawa et al. | 522/32 |
| 5,434,196 A | 7/1995 | Ohkawa et al. | 522/100 |
| 5,476,748 A | 12/1995 | Steinmann et al. | 430/280.1 |
| 5,525,645 A | 6/1996 | Ohkawa et al. | 522/74 |
| 5,739,214 A | 4/1998 | Schunck | 525/438 |
| 6,136,497 A | * 10/2000 | Melisaris et al. | 430/280.1 |

FOREIGN PATENT DOCUMENTS

| | | |
|---|---|---|
| EP | 0822445 | 2/1998 |
| EP | 0831127 | 3/1998 |
| WO | 97/42549 | 11/1997 |

OTHER PUBLICATIONS

Steinmann et al, PTO 2000–716, English Translation of EP 0822445 A1 published Feb. 4, 1998, United Patent and Trademark Office, translated by Schreiber Translations, Inc. ,49 pages, Dec. 1999.*

Product Information for Dupont Somos® Solid Imaging Materials, (Mar. 30, 1998 date on Web Page presented), 12 pgs.

CAS 128:174150, English Abstract of Steinmann et al., EP 0822445 and CA 2211628, earliest date of publication Jan. 29, 1998, American Chemical Society, 1999.

Derwent 1998–103049, English Abstract of Steinmann et al EP 0822445 and CA 2211628, earliest date of publication Jan. 29, 1998, Derwent Information Ltd., 1999.

* cited by examiner

Primary Examiner—Cynthia Hamilton
(74) Attorney, Agent, or Firm—Lyon & Lyon LLP

(57) ABSTRACT

The present invention relates to novel resin compositions containing at least one solid or liquid actinic radiation-curable and cationically polymerizable organic substance, an actinic radiation-sensitive initiator for cationic polymerization, an actinic radiation-curable and radical-polymerizable organic substance and an actinic radiation-sensitive initiator for radical polymerization. The actinic radiation-curable and cationically polymerizable organic substance is at least one glycidylether of a polyhydric aliphatic, alicyclic or aromatic alcohol having at least three epoxy groups with epoxy equivalent weight between 90 and 800 grams per equivalent, at least one solid or liquid alicyclic epoxide with an epoxy equivalent weight between 90 and 330 grams per equivalent having at least two epoxy groups and monomer purity greater than about 90% by weight, or at least a solid or liquid epoxycresol novolac or epoxyphenol novolac having epoxy equivalent weight between 130 and 350, or mixtures thereof. The use of the above-mentioned cationically polymerizable components substantially increases the heat deflection temperature of the cured articles while maintaining high photospeed, accuracy, wetting-recoatability, water resistance and good side wall finish. The present invention further relates to a method of producing a cured product, particularly a three-dimensional article, in which a compositions described above are treated with actinic radiation.

13 Claims, No Drawings

LIQUID, RADIATION-CURABLE COMPOSITION, ESPECIALLY FOR PRODUCING CURED ARTICLES BY STEREOLITHOGRAPHY HAVING HEAT DEFLECTION TEMPERATURES

This application is a division of U.S. application Ser. No. 09/055,832, filed Apr. 6, 1998 now U.S. Pat. No. 6,100,007.

The present invention relates to a liquid, radiation-curable composition which is particularly suitable for the production of three-dimensional shaped articles by means of stereolithography, to a process for the production of a cured product and, in particular, for the stereolithographic production of a three-dimensional shaped article from this composition having a high heat deflection temperature.

BACKGROUND

The production of three-dimensional articles of complex shape by means of stereolithography has been known for a relatively long time. In this technique the desired shaped article is built up from a liquid, radiation-curable composition with the aid of a recurring, alternating sequence of two steps (a) and (b); in step (a), a layer of the liquid, radiation-curable composition, one boundary of which is the surface of the composition, is cured with the aid of appropriate radiation, generally radiation produced by a preferably computer-controlled laser source, within a surface region which corresponds to the desired cross-sectional area of the shaped article to be formed, at the height of this layer, and in step (b) the cured layer is covered with a new layer of the liquid, radiation-curable composition, and the sequence of steps (a) and (b) is repeated until a so-called green model of the desired shape is finished. This green model is, in general, not yet fully cured and must therefore, normally, be subjected to post-curing.

The mechanical strength of the green model (modulus of elasticity, fracture strength), also referred to as green strength, constitutes an important property of the green model and is determined essentially by the nature of the stereolithographic-resin composition employed. Other important properties of a stereolithographic-resin composition include a high sensitivity for the radiation employed in the course of curing and a minimum curl factor, permitting high shape definition of the green model. In addition, for example, the precured material layers should be readily wettable by the liquid stereolithographic-resin composition, and of course not only the green model but also the ultimately cured shaped article should have optimum mechanical properties.

Another requirement that has recently become a high priority for stereolithography users is the high temperature performance of cured articles produced by stereolithography. It is usually measured by the Heat Deflection Temperature (HDT) or Glass Transition Temperature ($T_g$). The HDT value is determined by the ASTM method D648 applying a load of 66 psi.

For several years, high temperature performance for stereolithography produced articles has been achieved by the use of (meth)acrylate chemistry. This approach primarily entails the use of various commercially available urethane acrylate derivatives. EP-802455 of Teijin Seiki Corp. (Oct. 22, 1997) and JP 08323866 of Takemoto Oil & Fat Co Ltd (Dec. 10, 1996) describe acrylate urethane compositions for achieving good heat resistance and strength. However, a major disadvantage of such acrylate urethane compositions is that polymerization is hindered by atmospheric oxygen because polymerization is of a radical nature, that the cure shrinkage is unacceptably large, that the resins are irritant to the skin, particularly when the viscosity is low (low viscosity is highly preferred for stereolithography applications). Thus, acrylate urethane-based compositions show poor practicality for stereolithography.

Liquid, radiation-curable compositions for stereolithography which overcome the abovementioned problems of the acrylate chemistry are described, for example, in U.S. Pat. No. 5,476,748, which is incoporated herein by reference. These compositions are so-called hybrid systems, comprising free-radically and cationically photopolymerizable components. Such hybrid compositions comprise at least:

(A) a liquid difunctional or more highly functional epoxy resin or a liquid mixture consisting of difunctional or more highly functional epoxy resins;

(B) a cationic photoinitiator or a mixture of cationic photoinitiators;

(C) a free-radical photoinitiator or a mixture of free-radical photoinitiators; and (D) at least one liquid poly(meth)acrylate having a (meth) acrylate functionality of more than 2, (E) at least one liquid cycloaliphatic or aromatic diacrylate, and (F) a certain hydroxy compound that is selected from the group consisting of OH-terminated polyethers, polyesters and polyurethanes. Such hybrid systems can optionally further contain vinyl ether-based resins or other cationically cured components such as oxetanes, spiro-ortho esters.

A drawback of commercial cationic or hybrid cationic-radical stereolithographic compositions is that their cured articles show HDT values that are much lower than those based on acrylate chemistry, usually between 40 and 100° C.

Many hybrid compositions have been developed by companies for use in stereolithography process systems. For example, U.S. Pat. No. 5,434,196, assigned on its face to Asahi Denka Kogyo K.K., discloses resin compositions for so-called optical molding containing a mixture of epoxy resins and vinylethers, a cationic initiator, and a mixture of an acrylate compound and a triacrylate compound.

To date, there is no scientifically published or universally accepted term for defining the high temperature hybrid stereolithography resins. Through marketing brochures of stereolithography resin maufacturers and presentations in trade organizations, high temperature hybrid stereolithography resins are defined as those wherein their cured articles have HDT values over 80 and about 100° C. The highest HDT value ever reported for commercial hybrid stereolithography resins is about 100° C.

Despite all previous attempts, there exists a need for hybrid stereolithography compositions capable of producing high temperature performance cured articles for which the photospeed, accuracy, water resistance are commercially acceptable. Such hybrid compositions should possess HDT values over those of the existing ones, especially over 110° C.

SUMMARY OF THE INVENTION

The present invention relates to novel resin compositions containing at least one solid or liquid actinic radiation-curable and cationically polymerizable organic substance, an actinic radiation-sensitive initiator for cationic polymerization and an actinic radiation-curable and radical-polymerizable organic substance. The compositions contain an actinic radiation-sensitive initiator for radical polymerization. The actinic radiation-curable and cationically polymerizable organic substance is at least one glycidylether of a polyhydric aliphatic, alicyclic or aromatic alcohol having at least three epoxy groups with epoxy equivalent weight between 90 and 700 grams per equivalent and at least one solid or liquid alicyclic epoxide with an epoxy equivalent weight between 80 and 330 grams per equivalent having at least two epoxy groups, or mixtures thereof having a monomer purity greater than about 80% by weight.

The composition preferably contains 55–90%, more preferably 20 and 75% by weight, of the at least one solid or liquid actinic radiation-curable and cationically polymerizable organic substance, 0.05 to 12% by weight an actinic radiation-sensitive initiator for cationic polymerization, 5% to 25% by weight of an actinic radiation-curable and radical-polymerizable organic substance, and 0.02 to 10% by weight, with the sum total of components being 100 percent by weight.

The actinic radiation-curable and cationically polymerizable organic substance can contain not more than 20% by weight of at least one liquid or solid vinylether compound having at least two cationically-reactive groups in the molecule or a hydroxy-functionalized mono(poly)vinylether or mixtures thereof.

The actinic radiation-curable and cationically polymerizable organic substance can further contain at least one liquid or solid epoxy cresol novolac, epoxy phenol novolac, oxetane or spiro-ortho ester compound having at least two cationically-reactive groups in the molecule, or mixtures thereof.

The at least one glycidylether of a polyhydric aliphatic, alicyclic or aromatic alcohol having at least three epoxy groups is preferably between about 3 and 90%, more preferably 15% to 90% by weight of the at least one alicylic epoxide having at least two epoxy groups.

A further embodiment of the invention is a novel resin composition containing at least one solid or liquid actinic radiation-curable and cationically polymerizable organic substance, an actinic radiation-sensitive initiator for cationic polymerization, an actinic radiation-curable and radical-polymerizable organic substance; and an actinic radiation-sensitive initiator for radical polymerization. The actinic radiation-curable and cationically polymerizable organic substance contains at least one glycidylether of a polyhydric aliphatic, alicyclic or aromatic alcohol having at least three epoxy groups with epoxy equivalent weight between 90 and 700 grams/equivalent and at least one solid or liquid epoxy cresol novolac, or epoxy phenol novolac with epoxy equivalent weight between about 130 and 350 grams/equivalent having at least two functional groups, or mixtures thereof.

The composition preferably contains between about 55–90 % by weight of the at least one solid or liquid actinic radiation-curable and cationically polymerizable organic substance, 0.05 to 12% by weight an actinic radiation-sensitive initiator for cationic polymerization, 5–25% by weight of an actinic radiation-curable and radical-polymerizable organic substance, and 0.02 to 10% by weight an actinic radiation-sensitive initiator for radical polymerization, with the sum total of the components being 100 percent by weight.

The composition preferably contains the at least one solid or liquid epoxy cresol novolac, epoxy phenol novolac having at least two functional groups, or mixtures thereof between 2 and 50% by weight. The at least one solid or liquid epoxy cresol novolac or epoxy phenol novolac more preferably has an epoxy functionality at least 3. The at least one solid or liquid epoxy cresol novolac or epoxy phenol novolac most preferably has an epoxy functionality at least 4.

The composition can further include not more than 20% by weight of at least one liquid or solid vinylether compound having at least two cationically-reactive groups the molecule, or a hydroxy-functionalized mono(poly)vinylether, or mixtures thereof.

The actinic radiation-curable and cationically polymerizable organic substance further comprises at least one liquid or solid alicyclic polyfunctional epoxide, oxetane or spiro-ortho ester compound having at least two cationically-reactive groups in the molecule, or mixtures thereof.

The composition preferably contains the at least one glycidylether of a polyhydric aliphatic, alicyclic or aromatic alcohol having at least three epoxy groups at between 3 and 90%, more preferably at least 15% to 90% by weight of the at least one solid or liquid epoxy cresol novolac, epoxy phenol novolac having at least two functional groups.

The composition can further include about 0.5 to about 40 percent by weight of at least one solid or liquid cationic reactive modifier-flexibilizer. The at least one solid or liquid cationic reactive modifier is preferably a reactive epoxy modifier or reactive vinylether modifier or a hydroxy-functionalized vinylether or mixtures thereof. More preferably, the reactive modifier-flexibilizer includes at least one cationically reactive bifunctional aliphatic, alicyclic or aromatic compound containing a chain extension segment connected to the cationic reactive group with a molecular weight of at least about 100 and not more than 2000.

The composition can contain from about 4 to 30% by weight of a free radically curable component comprising at least 4% by weight one mono- or di(meth)acrylate and at least 4% by weight a poly(meth)acrylate having (meth)acrylate functionality greater than or equal to 3.

The present invention further relates to a method of producing a cured product, in which a compositions described above are treated with actinic radiation. More preferably, the present invention relates to a method for producing three-dimensional shaped articles comprising:

a) treating a radiation-curable composition described above with actinic radiation to form an at least partially cured layer on the surface of said composition within a surface region corresponding to a desired cross-sectional area of the three-dimensional article to be formed, b) covering the at least partially cured layer produced in step a) with a new layer of said radiation-curable composition, and c) repeating steps a) and b) until an article having the desired shape is formed, and optionally, d) post-curing the resulting article.

DETAILED DESCRIPTION OF THE INVENTION

The novel compositions herein contain, in the broadest sense, a mixture of at least one cationically curable compound and at least one photoinitator for the cationically cured compound(s), and a selected free-radically curable component, wherein the composition preferably contains substantially no polyol or hydroxyl-group containing compounds. The compositions further optionally contain a free radical photoinitiator/sensitizer and a cationic reactive modifier.

The cationically curable liquid or solid compound may expeditiously be an aliphatic, alicyclic or aromatic polyglycidyl compound or cycloaliphatic polyepoxide or epoxy cresol novolac or epoxy phenol novolac compound and which on average possess more than one epoxide group (oxirane ring) in the molecule. Such resins may have an aliphatic, aromatic, cycloaliphatic, araliphatic or heterocyclic structure; they contain epoxide groups as side groups, or these groups form part of an alicyclic or heterocyclic ring system. Epoxy resins of these types are known in general terms and are commercially available.

Polyglycidyl esters and poly(β-methylglycidyl) esters are one example of suitable epoxy resins. Said polyglycidyl esters can be obtained by reacting a compound having at least two carboxyl groups in the molecule with epichlorohydrin or glycerol dichlorohydrin or β-methylepichlorohydrin. The reaction is expediently carried out in the presence of bases. The compounds having at least two carboxyl groups in the molecule can in this case be, for example, aliphatic polycarboxylic acids, such as glutaric acid, adipic acid, pimelic acid, suberic acid, azelaic acid, sebacic acid or dimerized or trimerized linoleic acid. Likewise, however, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids such as, for example, phthalic acid, isophthalic acid, trimellitic acid or pyromellitic acid, or else carboxyl-terminated adducts, for example of trimellitic acid and polyols, for example glycerol or 2,2-bis(4-hydroxycyclohexyl)propane, can be used.

Polyglycidyl ethers or poly(β-methylglycidyl) ethers can likewise be used. Said polyglycidyl ethers can be obtained by reacting a compound having at least two free alcoholic hydroxyl groups and/or phenolic hydroxyl groups with a suitably substituted epichlorohydrin under alkaline conditions or in the presence of an acidic catalyst followed by alkali treatment. Ethers of this type are derived, for example, from acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. Suitable glycidyl ethers can also be obtained, however, from cycloaliphatic alcohols, such as 1,3- or 1,4-dihydroxycyclohexane, bis(4-hydroxycyclo-hexyl)methane, 2,2-bis(4-hydroxycyclohexyl)propane or 1,1-bis(hydroxymethyl)cyclohex-3-ene, or they possess aromatic rings, such as N,N-bis(2-hydroxyethyl)aniline or p,p'-bis(2-hydroxyethylamino)diphenylmethane.

Particularly important representatives of polyglycidyl ethers or poly(β-methylglycidyl) ethers are based on phenols; either on monocylic phenols, for example on resorcinol or hydroquinone, or on polycyclic phenols, for example on bis(4-hydroxyphenyl)methane (Bisphenol F), 2,2-bis(4-hydroxyphenyl)propane (Bisphenol A), or on condensation products, obtained under acidic conditions, of phenols or cresols with formaldehyde, such as phenol novolaks and cresol novolaks. These compounds are particularly preferred as epoxy resins for the present invention, especially diglycidyl ethers based on Bisphenol A and Bisphenol F and mixtures thereof.

Poly(N-glycidyl) compounds are likewise suitable for the purposes of the present invention and are obtainable, for example, by dehydrochlorination of the reaction products of epichlorohydrin with amines containing at least two amine hydrogen atoms. These amines may, for example, be n-butylamine, aniline, toluidine, m-xylylenediamine, bis(4-aminophenyl)methane or bis(4-methylaminophenyl) methane. However, other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Poly(S-glycidyl) compounds are also suitable as the cationic curing resin herein, examples being di-S-glycidyl derivatives derived from dithiols, for example ethane-1,2-dithiol or bis(4-mercaptomethylphenyl) ether.

Examples of epoxide compounds in which the epoxide groups form part of an alicyclic or heterocyclic ring system include bis(2,3-epoxycyclopentyl) ether, 2,3-epoxycyclopentyl glycidyl ether, 1,2-bis(2,3-epoxycyclopentyloxy)ethane, bis(4-hydroxycyclohexyl) methane diglycidyl ether, 2,2-bis(4-hydroxycyclohexyl) propane diglycidyl ether, 3,4-epoxycyclohexyl-methyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl)hexanedioate, di(3,4-epoxy-6-methylcyclohexylmethyl) hexanedioate, ethylenebis(3,4-epoxycyclohexane-carboxylate, ethanediol di(3,4-epoxycyclohexylmethyl)ether, vinylcyclohexene dioxide, dicyclopentadiene diepoxide or 2-(3,4-epoxycyclohexyl-5, 5-spiro-3,4-epoxy)cyclohexane-1,3-dioxane.

However, it is also possible to employ epoxy resins in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

Also conceivable is the use of liquid prereacted adducts of epoxy resins, such as those mentioned above, with hardeners for epoxy resins.

It is of course also possible to use liquid mixtures of liquid or solid epoxy resins in the novel compositions.

Examples of cationically polymerizable organic substances other than epoxy resin compounds include oxetane compounds, such as trimethylene oxide, 3,3-dimethyloxetane and 3,3-dichloromethyloxethane, 3-ethyl-3-phenoxymethyloxetane, and bis(3-ethyl-3-methyloxy) butane; oxolane compounds, such as tetrahydrofuran and 2,3-dimethyl-tetrahydrofuran; cyclic acetal compounds, such as trioxane, 1,3-dioxalane and 1,3,6-trioxan cycloctane; cyclic lactone compounds, such as β-propiolactone and ε-caprolactone; thiirane compounds, such as ethylene sulfide, 1,2-propylene sulfide and thioepichlorohydrin; thiotane compounds, such as 1,3-propylene sulfide and 3,3-dimethylthiothane.

Vinyl ethers that can be used in stereolithography compositions include ethyl vinylether, n-propyl vinylether, isopropyl vinylether, n-butyl vinylether, isobutyl vinylether, octadecyl vinylether, cyclohexyl vinylether, butanediol divinylether, cyclohexanedimethanol divinylether, diethyleneglycol divinylether, triethyleneglycol divinylether, tert-butyl vinylether, tert-amyl vinylether, ethylhexyl vinylether, dodecyl vinylether, ethyleneglycol divinylether, ethyleneglycolbutyl vinylether, hexanediol divinylether, triethyleneglycol methylvinylether, tetraethyleneglycol divinylether, trimethylolpropane trivinylether, aminopropyl vinylether, diethylaminoethyl vinylether, ethylene glycol divinyl ether, polyalkylene glycol divinyl ether, alkyl vinyl ether and 3,4-dihydropyran-2-methyl 3,4-dihydropyran-2-carboxylate. Commercial vinyl ethers include the Pluriol-E200 divinyl ether (PEG200-DVE), poly-THF290 divinylether (PTHF290-DVE) and polyethyleneglycol-520 methyl vinylether (MPEG500-VE) all of BASF Corp.

Hydroxy-functionalized mono(poly)vinylethers include polyalkyleneglycol monovinylethers, polyalkylene alcohol-terminated polyvinylethers, butanediol monovinylether, cyclohexanedimethanol monovinylether, ethyleneglycol monovinylether, hexanediol monovinylether, diethyleneglycol monovinylether.

Another highly important class of vinyl ethers that are suitable for stereolithography and may be used in the hybrid flexible stereolithography compositions are all those included in the U.S. Pat. No. 5,506,087, which is incorporated herein by reference. More preferred are aromatic or alicyclic vinyl ethers. As an example, commercial vinylethers include Vectomer 4010, Vectomer 5015, Vectomer 4020, Vectomer 21010 and Vectomer 2020 of Allied Signal Corp., Morristown, N.J. Most preferred are Vectomer 4010 and Vectomer 5015.

Other cationically cured compounds include spiro ortho esters that are prepared by reacting epoxy compounds with lactone; ethylenically unsaturated compounds, such as vinylcyclohexane, n-vinyl-2-pyrrolidone and its various derivatives, isobutylene and polybutadiene, and derivatives of the above compounds.

The above cationically polymerizable compounds may be used alone or as a mixture of two or more thereof depending upon the desired performance.

Additional cationically curable commercial products that can be used herein include: Uvacure 1500, Uvacure 1501, Uvacure 1502, Uvacure 1530, Uvacure 1531, Uvacure 1532, Uvacure 1533, Uvacure 1534, Uvacure 1561, Uvacure 1562, all commercial products of UCB Radcure Corp., Smyrna, Ga.; UVR-6105, UVR-6100, UVR-6110, UVR-6128, UVR-6200, UVR-6216 of Union Carbide Corp., Danburry, Conn.; the Araldite GY series that is Bisphenol A epoxy liquid resins, the Araldite CT and GT series that is Bisphenol A epoxy solid resins, the Araldite GY and PY series that is Bisphenol F epoxy liquids, the cycloaliphatic epoxides Araldite CY 179 and PY 284, the Araldite DY and RD reactive diluents series, the Araidite ECN series of epoxy cresol novolacs, the Araldite EPN series of epoxy phenol novolacs, all commercial products of Ciba Specialty Chemicals Corp., the Heloxy 48, Heloxy 44, Heloxy 84 and the other Heloxy product line, the EPON product line, all of Shell Corp., the DER series of flexible aliphatic and Bisphenol A liquid or solid epoxy resins, the DEN series of epoxy novolac resins, all commercial products of Dow Corp., Celoxide 2021, Celoxide 2021P, Celoxide 2081, Celoxide 2083, Celoxide 2085, Celoxide 2000, Celoxide 3000, Glycidole, AOEX-24, Cyclomer A200, Cyclomer M-100, Epolead GT-300, Epolead GT-302, Epolead GT-400, Epolead 401, Epolead 403, (Daicel Chemical Industries Co., Ltd.), Epicoat 828, Epicoat 812, Epicoat 872, Epicoat CT 508, (Yuka Shell Co., Ltd.), KRM-2100, KRM-2110, KRM-2199, KRM-2400, KRM-2410, KRM-2408, KRM-2490, KRM-2200, KRM-2720, KRM-2750 (Asahi Denka Kogyo Co., Ltd.).

It is possible to employ a host of known and industrially tried and tested cationic photoinitiators for epoxy resins for purposes of practicing the instant invention. Examples of these photoinitiators are onium salts with anions of weak nucleophilicity. Examples thereof are halonium salts, iodosyl salts or sulfonium salts, sulfoxonium salts, or diazonium salts, as described for example in U.S. Pat. No. 3,708,296. Other cationic photoinitiators are metallocene salts.

An overview of further commonplace onium salt initiators and/or metallocene salts is offered by "UV-Curing, Science and Technology", (Editor: S. P. Pappas, Technology Marketing Corp., 642 Westover Road, Stamford, Conn., USA) or "Chemistry & Technology of UV & EB Formulations for Coatings, Inks & Paints", Vol. 3 (edited by P. K. T. Oldring), which is incorporated herein by reference.

Preferred compositions comprise, as a cationic photoinitiator, a compound of the formula (B-I), (B-II) or (B-III):

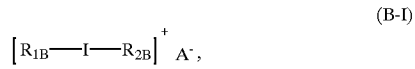
(B-I)

(B-II)

(B-III)

in which $R_{1B}$, $R_{2B}$, $R_{3B}$, $R_{4B}$, $R_{5B}$, $R_{6B}$, and $R_{7B}$ independently of one another are $C_6$–$C_{18}$aryl which is unsubstituted or substituted by appropriate radicals, and $A^-$ is $CF_3SO_3^-$ or an anion of the formula $[LQ_{mB}]^-$, where L is boron, phosphorus, arsenic or antimony, Q is a halogen atom, or some of the radicals Q in an anion $LQ_m^-$ may also be hydroxyl groups, and mB is an integer corresponding to the valency of L enlarged by 1.

Examples of $C_6$–$C_{18}$aryl in this context are phenyl, naphthyl, anthryl and phenanthryl. In these substituents present for appropriate radicals are alkyl, preferably $C_1$–$C_6$alkyl, such as methyl, ethyl, n-propyl, isopropyl, n-butyl, sec-butyl, isobutyl, tert-butyl or the various pentyl or hexyl isomers, alkoxy, preferably $C_1$–$C_6$alkoxy, such as methoxy, ethoxy, propoxy, butoxy, pentoxy or hexoxy, alkylthio, preferably $C_1$–$C_6$alkylthio, such as methylthio, ethylthio, propylthio, butylthio, pentylthio or hexylthio, halogen, such as fluorine, chlorine, bromine or iodine, amino groups, cyano groups, nitro groups or arylthio, such as phenylthio. Examples of preferred halogen atoms Q are chlorine and, in particular, fluorine. Preferred anions $LQ_{mB}$ are $BF_4^-$, $PF_6^-$, $AsF_6^-$, $SbF_6^-$ and $SbF_5(OH)^-$.

Particularly preferred compositions are those comprising as a cationic photoinitiator a compound of the formula (B-III), in which $R_{5B}$, $R_{6B}$ and $R_{7B}$ are aryl, aryl being in particular phenyl or biphenyl or mixtures of these two groups.

Further preferred compositions are those comprising as a photoinitiator a compound of the formula (B-IV):

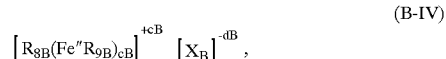
(B-IV)

in which cB is 1 or 2, dB is 1, 2, 3, 4 or 5, $X_B$ is a non-nucleophilic anion, especially $PF_6^-$, $AsF_6^-$, $SbF_6^-$, $CF_3SO_3^-$, $C_2F_5SO_3^-$, $n\text{-}C_3F_7SO_3^-$, $n\text{-}C_4F_9SO_3^-$, $n\text{-}C_6F_{13}SO_3^-$ and $n\text{-}C_8F_{17}SO_3^-$, $R_{8B}$ is a π-arene and $R_{9B}$ is an anion of a π-arene, especially a cyclopentadienyl anion.

Examples of π-arenes as $R_{8B}$ and anions of π-arenes as $R_{9B}$ can be found in EP-A-0 094 915. Examples of preferred π-arenes as $R_{8B}$ are toluene, xylene, ethylbenzene, cumene, methoxybenzene, methylnaphthalene, pyrene, perylene, stilbene, diphenylene oxide and diphenylene sulfide. Cumene, methylnaphthalene or stilbene are particularly preferred. Examples of non-nucleophilic anions $X^-$ are $FSO_3^-$, anions of organic sulfonic acids, of carboxylic acids or of anions $LQ_{mB}^-$. Preferred anions are derived from partially fluoro- or perfluoro-aliphatic or partially fluoro- or perfluoro-aromatic carboxylic acids such as $CF_3SO_3^-$, $C_2F_5SO_3^-$, $n\text{-}C_3F_7SO_3^-$, $n\text{-}C_4F_9SO_3^-$, $n\text{-}C_6F_{13}SO_3^-$, $n\text{-}C_8F_{17}SO_3^-$, or in particular from partially fluoro- or perfluoro-aliphatic or partially fluoro- or perfluoro-aromatic organic sulfonic acids, for example from $C_6F_5SO_3^-$, or preferably are anions $LQ_{mB}^-$, such as $BF_4^-$, $PF_6^-$, $AsF_6^-$, $SbF_6^-$, and $SbF_5(OH)^-$. Preference is given to $PF_6^-$, $AsF_6^-$, $SbF_6^-$, $CF_3SO_3^-$, $C_2F_5SO_3^-$, $n\text{-}C_3F_7SO_3^-$, $n\text{-}C_4F_9SO_3^-$, $n\text{-}C_6F_{13}SO_3^-$ and $n\text{-}C_8F_{17}SO_3^-$.

The metallocene salts can also be employed in combination with oxidizing agents. Such combinations are described in EP-A-0 126 712.

In order to increase the light yield it is possible, depending on the type of initiator, also to employ sensitizers. Examples of these are polycyclic aromatic hydrocarbons or aromatic keto compounds. Specific examples of preferred sensitizers are mentioned in EP-A-0 153 904.

More preferred commercial cationic photoinitiators are UVI-6974, UVI-6970, UVI-6960, UVI-6990 (manufactured by Union Carbide Corp.), CD-1010, CD-1011, CD-1012 (manufactured by Sartomer Corp.), Adekaoptomer SP-150, SP-151, SP-170, SP-171 (manufactured by Asahi Denka Kogyo Co., Ltd.), Irgacure 261 (Ciba Specialty Chemicals Corp.), CI-2481, CI-2624, CI-2639, CI-2064 (Nippon Soda Co, Ltd.), DTS-102, DTS-103, NAT-1 03, NDS-103, TPS-103, MDS-103, MPI-103, BBI-103 (Midori Chemical Co, Ltd.). Most preferred are UVI-6974, CD-1010, UVI-6970, Adekaoptomer SP-170, SP-171, CD-1012, and MPI-103. The above-mentioned cationic photoinitiators can be used either individually or in combination of two or more.

It is possible to employ all types of photoinitiators which form free radicals given the appropriate irradiation. Typical representatives of free-radical photoinitiators are benzoins, such as benzoin, benzoin ethers, such as benzoin methyl ether, benzoin ethyl ether and benzoin isopropyl ether, benzoin phenyl ether and benzoin acetate, acetophenones, such as acetophenone, 2,2-dimethoxy-acetophenone and 1,1-dichloroacetophenone, benzil, benzil ketals, such as benzil dimethylketal and benzil diethyl ketal, anthraquinones, such as 2-methylanthraquinone, 2-ethylanthra-quinone, 2-tert-butylanthraquinone, 1-chloroanthraquinone and 2-amylanthraquinone, and also triphenylphosphine, benzoylphosphine oxides, for example 2,4,6-trimethylbenzoyl-diphenylphosphine oxide (Luzirin® TPO), bisacylphosphine oxides, benzophenones, such as benzophenone and 4,4'-bis(N,N'-dimethylamino) benzophenone, thioxanthones and xanthones, acridine derivatives, phenazine derivatives, quinoxaline derivatives or 1-phenyl-1,2-propanedione 2-O-benzoyl oxime, 1-aminophenyl ketones or 1-hydroxy phenyl ketones, such as 1-hydroxycyclohexyl phenyl ketone, phenyl 1-hydroxyisopropyl ketone and 4-isopropylphenyl 1-hydroxyisopropyl ketone, all of which constitute known compounds.

Particularly suitable free-radical photoinitiators which are used customarily in combination with a He/Cd laser as light source are acetophenones, such as 2,2-dialkoxybenzophenones and 1-hydroxy phenyl ketones, for example 1-hydroxycyclohexyl phenyl ketone or 2-hydroxy-isopropyl phenyl ketone (=2-hydroxy-2,2-dimethylacetophenone), but especially 1-hydroxy-cyclohexyl phenyl ketone.

A class of photoinitiators that are commonly employed when using argon ion lasers comprises the benzil ketals, for example benzil dimethyl ketal. In particular, the photoinitiator used is an α-hydroxy phenyl ketone, benzil dimethyl ketal or 2,4,6-trimethylbenzoyldiphenyl-phosphine oxide.

A further class of suitable photoinitiators constitutes the ionic dye-counterion compounds, which are capable of absorbing actinic radiation and of generating free radicals which are able to initiate the polymerization of the acrylates. The novel compositions containing ionic dye-counterion compounds can in this way be cured more variably with visible light in an adjustable wavelength range of 400–700 nm. Ionic dye-counterion compounds and their mode of action are known, for example U.S. Pat. Nos. 4,751,102, 4,772,530 and 4,772,541. Examples of suitable ionic dye-counterion compounds are the anionic dye-iodonium ion complexes, the anionic dye-pyryllium ion complexes and, in particular, the cationic dye-borate anion compounds of the following formula:

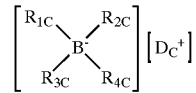

in which $D_C^+$ is a cationic dye and $R_{1C}$, $R_{2C}$, $R_{3C}$ and $R_{4C}$ independently of one another are each an alkyl, aryl, alkaryl, allyl, aralkyl, alkenyl, alkynyl, an alicyclic or saturated or unsaturated heterocyclic group. Preferred definitions for the radicals $R_{1C}$ to $R_{4C}$ can be taken for example, from EP-A-0 223 587.

As photoinitiator, the novel compositions preferably include a 1-hydroxy phenyl ketone, especially 1-hydroxycyclohexyl phenyl ketone.

The free radical and cationic photoinitiators are added in effective quantities, i.e. in quantities from 0.1 to 12, particularly from 0.5 to 9 percent by weight, based on the overall quantity of the composition. If the novel compositions are used for stereolithographic processes, in which laser beams are normally employed, it is essential for the absorption capacity of the composition to be matched, by way of the type and concentration of the photoinitiators, in such a way that the depth of curing at normal laser rate is from approximately 0.1 to 2.5 mm.

The novel mixtures may also contain various photoinitiators of different sensitivity to radiation of emission lines with different wavelengths to obtain a better utilization of a UV/VIS light source which emits emission lines of different wavelengths. In this context it is advantageous for the various photoinitiators to be selected such, and employed in a concentration such, that equal optical absorption is produced with the emission lines used.

The free radically curable component preferably comprises at least one solid or liquid poly(meth)acrylate, for example, be di-, tri-, tetra- or pentafunctional monomeric or oligomeric aliphatic, cycloaliphatic or aromatic acrylates or methacrylates. The compounds preferably have a molecular weight of from 200 to 500.

Examples of suitable aliphatic poly(meth)acrylates having more than two unsaturated bonds in their molecules are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol monohydroxytriacrylate or -methacrylate, or dipentaerythritol monohydroxypentaacrylate or -methacrylate.

It is additionally possible, for example, to use polyfunctional urethane acrylates or urethane methacrylates. These urethane(meth)acrylates are known to the person skilled in the art and can be prepared in a known manner by, for example, reacting a hydroxyl-terminated polyurethane with acrylic acid or methacrylic acid, or by reacting an isocyanate-terminated prepolymer with hydroxyalkyl(meth)acrylates to give the urethane(meth)acrylate.

Examples of suitable aromatic tri(meth)acrylates are the reaction products of triglycidyl ethers of trihydric phenols and phenol or cresol novolaks containing three hydroxyl groups, with (meth)acrylic acid.

The (meth)acrylates used herein are known compounds and some are commercially available, for example from the SARTOMER Company under product designations such as SR®295, SR®350, SR®351, SR®367, SR®399, SR®444, SR®454 or SR®9041.

Preferred compositions are those in which the free radically curable component contains a tri(meth)acrylate or a penta(meth)acrylate.

Suitable examples of di(meth)acrylates are the di(meth)acrylates of cycloaliphatic or aromatic diols such as 1,4-dihydroxymethylcyclohexane, 2,2-bis(4-hydroxycyclohexyl)propane, bis(4-hydroxycyclohexyl)methane, hydroquinone, 4,4'-dihydroxybi-phenyl, Bisphenol A, Bisphenol F, bisphenol S, ethoxylated or propoxylated Bisphenol A, ethoxylated or propoxylated Bisphenol F or ethoxylated or propoxylated bisphenol S. Di(meth)acrylates of this kind are known and some are commercially available.

Other di(meth)acrylates which can be employed are compounds of the formulae (F-I), (F-II), (F-III) or (F-IV):

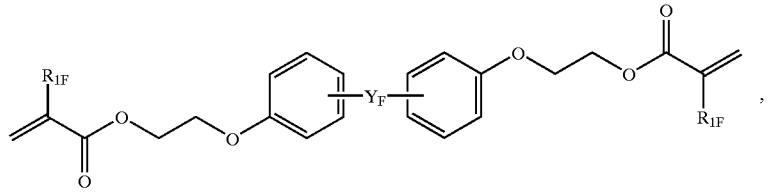

(F-I)

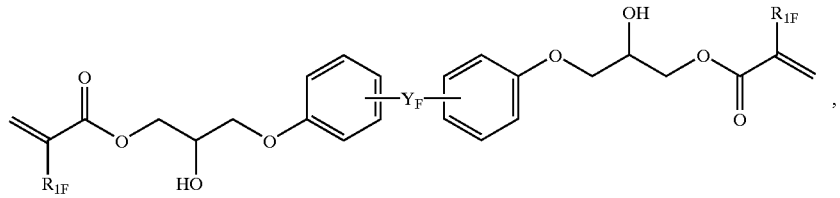

(F-II)

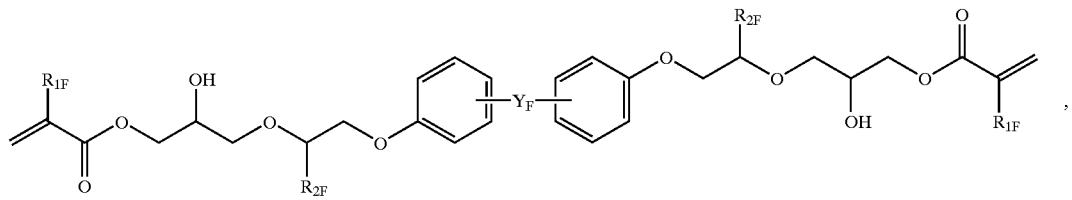

(F-III)

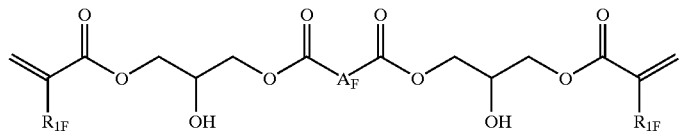

(F-IV)

in which $R_{1F}$ is a hydrogen atom or methyl, $Y_F$ is a direct bond, $C_1$–$C_6$alkylene, —S—, —O—, —SO—, —SO$_2$— or —CO—, $R_{2F}$ is a $C_1$–$C_8$alkyl group, a phenyl group which is unsubstituted or substituted by one or more $C_1$–$C_4$alkyl groups, hydroxyl groups or halogen atoms, or is a radical of the formula —CH$_2$—OR$_{3F}$ in which $R_{3F}$ is a $C_1$–$C_8$alkyl group or phenyl group, and $A_F$ is a radical selected from the radicals of the formulae:

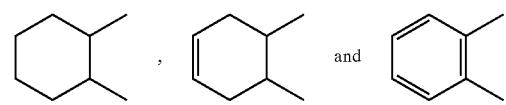

Further examples of possible di(meth)acrylates are compounds of the formulae (F-V), (F-VI), (F-VII) and (F-VIII):

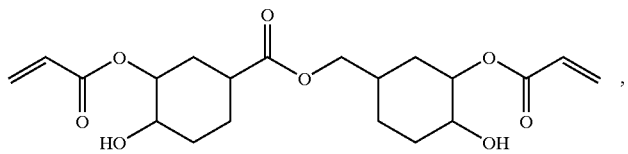

(F-V)

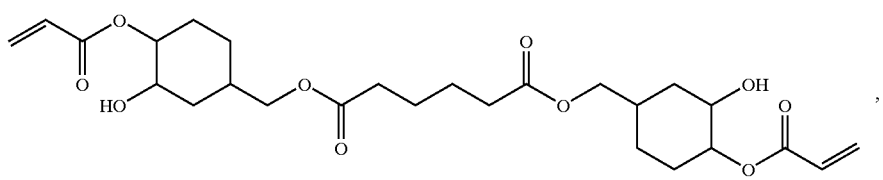

(F-VI)

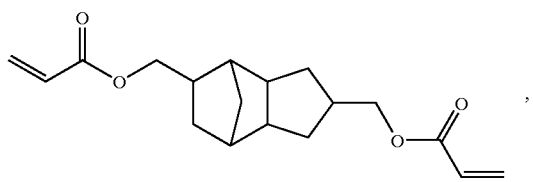

(F-VII)

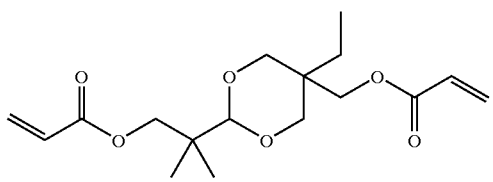

(F-VIII)

These compounds of the formulae (F-I) to (F-VIII) are known and some are commercially available. Their preparation is also described in EP-A-0 646 580.

Examples of commercially available products of these polyfunctional monomers are KAYARAD R-526, HDDA, NPGDA, TPGDA, MANDA, R-551, R-712, R-604, R-684, PET-30, GPO-303, TMPTA, THE-330, DPHA-2H, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040 R-011, R-300, R-205 (Nippon Kayaku Co., Ltd.), Aronix M-210, M-220, M-233, M-240, M-215, M-305, M-309, M-310, M-315, M-325, M-400, M-6200, M-6400 (Toagosei Chemical Industry Co, Ltd.), Light acrylate BP-4EA, BP-4PA, BP-2EA, BP-2PA, DCP-A (Kyoeisha Chemical Industry Co., Ltd.), New Frontier BPE-4, TEICA, BR-42M, GX-8345 (Daichi Kogyo Seiyaku Co., Ltd.), ASF-400 (Nippon Steel Chemical Co.), Ripoxy SP-1506, SP-1507, SP-1509, VR-77, SP-4010, SP-4060 (Showa Highpolymer Co., Ltd.), NK Ester A-BPE-4 (Shin-Nakamura Chemical Industry Co., Ltd.), SA-1002 (Mitsubishi Chemical Co., Ltd.), Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

According to the present invention, it is preferrable that the radiation-curable and cationically polymerizable organic component (a) comprise at least one component (a1) that is a polyfunctional aliphatic, alicyclic or aromatic glycidylether(s) having at least three epoxy groups per molecule. Component (a1) has been found to 1) substantially increase the high temperature performance of the cured article, 2) improve the wet recoatability of the liquid composition and 3) improve the side wall finish of the cured article. More preferred compositions contain component (a1) that is a polyfunctional aliphatic, alicyclic or aromatic glycidylether, or mixtures thereof having at least three epoxy groups per molecule with an epoxy equivalent weight (EEW) between 90 and 800. Most preferred are those having an EEW weight between 90 and 650. The triglycidylether of trimethylolpropane, Heloxy 48 of Shell Corp., having an EEW of about 140–160 is one of the most preferred polyglycidylether compounds. The polyfunctional glycidylether (s) having at least three epoxy groups in their molecule preferably comprises between about 2 and 90% by weight the overall cationic component (a), more preferably, between about 9 and about 60% by weight, most preferably between 10 and 50% by weight.

According to the present invention, it is preferrable that the radiation-curable and cationically polymerizable organic component (a) comprise at least one component (a2) that is an alicyclic polyepoxide having at least two epoxy groups per molecule. Component (a2) has been found to be effective at increasing the high temperature performance of cured articles when it is in a very pure form, which means elimination of its dimers or trimers at the highest possible extent. More preferred compositions contain component (a2) with a monomer purity of over about 80% and epoxy equivalent weight between 80 and 330, more preferably between 90 and 300. Most preferred compositions contain component (a2) in a pure form having epoxy equivalent weight between 100 and 280 wherein dimers or trimers or oligomers are substantially eliminated. Commercial products having over about 90% monomer purity to greater than about 94% monomer purity are most preferred. For example, 3,4-epoxycyclohexylmethyl 3',4'-epoxycyclohexanecarboxylate (ECEC) having an epoxy equivalent weight between 130 and 145 with varying degrees of monomer purity can be purchased through various commercial sources. More preferred is Araldite CY179 of Ciba Speciality Chemicals containing a limited percentage of dimers or oligomers, such that the monomer purity is about 90%. Most preferred is UVR6105 of Union Carbide Corp., which contains a smaller percentage of oligomers than Araldite CY 179. The most preferred is Uvacure 1500 of UCB Radcure Corp., which is the purest ECEC known by the inventors. Table 1 in the example demonstrate that the high monomer purity of Uvacure 1500 produces a cured article having an unusually high thermal performance. Even a small percentage by weight of dimers or trimers in a cycloaliphatic epoxide, component (a2), can drastically reduce the HDT value of the cured article. Preferred compositions contain component (a2) at between 5 to 80 % by weight. More preferred compositions contain component (a2) at between 10 and 75% by weight. Most preferred compositions contain component (a2) at between 15 to 70% by weight.

According to the present invention, it is preferrable that the radiation-curable and cationically polymerizable organic component (a) comprise at least one component (a3) that is a solid or liquid epoxycresol novolac or epoxyphenol novolac having at least two epoxy groups per molecule. Component (a3) has been found to be very effective at increasing the high temperature performance of cured articles when its epoxy functionality becomes higher than 2. The epoxy equivalent weight of component (a3) is between 130 to 350 g/eq. More preferred compositions contain component (a3) that is epoxycresol novolac or epoxyphenol novolacs having an epoxy functionality at least about 3. Most preferred are those with epoxy functionality over about 4 to greater than about 5. For example, epoxycresol novolac ECN1299 has an epoxy equivalent weight number between 217 and 244 with an epoxy functionality of about 5.4 (product of Ciba Specialty Chemicals) and produces a cured article having high temperature performance. Preferred amounts for component (a3) is between 3 and 80% by weight. More preferred amount is between 8 to 75% by weight. The most preferred amount is between 10 to 55% by weight.

Component (a) optionally preferably includes vinyl-ether group containing compounds. Preferred examples are aliphatic polyalkoxy di(poly)vinylethers, polyalkylene di(poly)vinylethers and hydroxy-functionalized mono(poly) vinylethers. More preferred vinylethers are those having aromatic or alicyclic moities in their molecules. Preferred amounts of the vinylether component is between 0.5 to 20% by weight. More preferred amounts is between 2 to 17% by weight. Most preferred amounts is between 3 to 14 by weight.

According to the present invention, it is preferrable that radiation curable and radically polymerizable organic component (c) be contained in amounts of 4 to 35% by weight. More referred compositions contain component (c) between 7 to 30% by weight. Most preferred are compositions containing component (c) between 8 to 20% by weight. Most preferred compositions also contain 4 to 10% by weight of at least one liquid or solid poly(meth)acrylate having a (meth)acrylate functionality greater than or equal to 3, and from 4 to 10% by weight of one or more di(meth) acrylates.

Preferred compositions contain component (b) that is a cationic photoinitiator or a mixture of cationic photoinitiators between 0.05 to 12% by weight. More preferred compositions contain component (b) between 0.1 to 11% by weight. Most preferred compositions contain component (b) between 0.15 to 10% by weight.

It is preferred for component (d) that is a free-radical photoinitiator or a mixture of free-radical photoinitiators to be contained between 0.1 to 10% by weight. More preferred compositions contain component (d) between 0.3 to 8% by weight. Most preferred compositions contain component (d) between 0.4 to 7% by weight.

Preferred, more preferred and most preferred compositions may contain between 0 to 10% by weight of additives or reactive diluents.

To impart flexibility and impact resistance, the novel compositions herein optionally further include a cationic reactive modifier (epoxy-, vinylether-, spiro-orthoester- or oxetane-based). The cationic reactive modifier component imparts flexibility and impact resistance to the cured article without compromising photospeed, or accuracy of the liquid composition or water resistance for the cured article. The selected cationic reactive modifiers should be at least bifunctional compounds, more preferably aliphatic, alicyclic and/ or aromatic compounds having, on average, at least two cationically reactive groups per molecule containing at least one chain extension segment with a molecular weight of at least about 100 and not more than 2000. Each chain extension segment is an organic or inorganic chain that connects the epoxide rings or vinylether groups or other cationically reactive groups with the core or backbone of the main molecule. The equivalent weight per epoxide can vary between about 180 and about 2000. The equivalent weight per vinylether group or any other cationically cured group can vary between about 100 and 1600.

Cationic reactive modifiers having more than two cationically reactive groups and a corresponding number of chain extension segments are preferred. Preferred chain extension segments are unsubstituted aliphatic or aliphatic substituted with $C_1$–$C_{10}$ alkyl or $C_1$–$C_{10}$ alkoxy groups, unsubstituted alkylene or substituted with $C_1$–$C_{10}$alkyl or $C_1$–$C_{10}$alkoxy alkylene groups, unsubstituted cycloaliphatic or substituted cycloaliphatic with $C_1$–$C_{10}$alkyl or $C_1$–$C_{10}$ alkoxy groups, unsubstituted aromatic or aromatic substituted with $C_1$–$C_{10}$alkyl or $C_1$–$C_{10}$ alkoxy groups, saturated and unsaturated polyesters, polyethers, polysiloxanes, polysilanes, polycarbonates, polyalkylene ethers. A chain extension segment having 4 to 60 repeating $C_2$–$C_4$alkoxy groups, for example isopropoxy, propoxy and ethoxy, is most preferred. Similarly, for aromatic epoxides, the chain extension segment between the glycidyl ether groups and the aromatic nucleus of polyhydric alcohol should have a molecular weight of at least about 100 and not more than 2000.

Also preferred are polyglycidyl esters and poly(β-methylglycidyl)esters having chain extension segments having a molecular weight of at least about 100 and not more than 2000. Said compounds can be obtained by reacting a compound having at least two carboxyl groups in the molecule with epichlorohydrin or glycerol dichlorohydrin or β-methylepichlorohydrin. Likewise, it is possible to employ cycloaliphatic polycarboxylic acids, for example tetrahydrophthalic acid. It is also possible to use aromatic polycarboxylic acids such as phthalic acid, pyromellitic acid, or else carboxyl-terminated adducts, for example of trimellitic acid and polyols, for example glycerol or 2,2-bis(4-hydroxycyclohexyl)propane.

Epoxidized oils (e.g. the Union Carbide FLEXOL, LOE or EPO) having chain extension segments having a molecular weight of at least about 400 and not more than 3,000 are also preferred epoxy-based cationic reactive modifiers.

A more preferred epoxy-based cationic reactive modifier is a liquid or solid polyglycidyl ether of a polyhydric alcohol or adducts or polybasic acid thereof with alkylene oxide (e.g. triglycidyl ether of glycerol chain extended by between five and fourteen isopropoxy groups per glycidyl ether group). Also preferred is a dimer acid diglycidylether having an aliphatic backbone of between about $C_{15}$ to about $C_{150}$, such as Heloxy® 71 having an aliphatic backbone of about $C_{34}$, polyglycol diepoxides having a backbone consisting between about 4 and 50 isopropoxy units, such as Heloxy® 32, with 7 isopropoxy groups, polyglycidylethers of castor oil, such as Heloxy® 505, all three products are commercially available by Shell Corp., Houston, Tex. The most preferred epoxy-based cationic reactive modifier is a triglycidyl ether of polypropoxylated gycerol having the following structure:

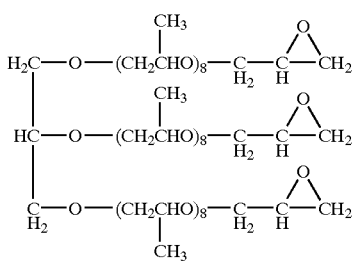

which is commercially available under the tradename Heloxy® 84 from Shell Company, Houston, Tex.

Other preferred cationic reactive modifiers are based on liquid or solid vinyl ethers, such as polyalkylene glycol di-(poly) vinyl ether, tetraethyleneglycol divinylether, hydroxy-functionalized mono(poly)vinylethers, also cycloaliphatic or aromatic (di)polyvinyl ethers chain extended with at least one chain extension segment. Preferred chain extension segments are unsubstituted aliphatic or aliphatic substituted with $C_1$–$C_{10}$alkyl or $C_1$–$C_{10}$alkoxy groups, unsubstituted alkylene or alkylene substituted with $C_1$–$C_{10}$alkyl or $C_1$–$C_{10}$alkoxy groups, unsubstituted cycloaliphatic or cycloaliphatic substituted with $C_1$–$C_{10}$alkyl or $C_1$–$C_{10}$alkoxy groups, unsubstituted aromatic or aromatic substituted with $C_1$–$C_{10}$alkyl or $C_1$–$C_{10}$alkoxy groups, saturated and unsaturated polyesters, polyethers, polysiloxanes, polysilanes, polycarbonates, polyalkylene ethers. The vinylether-based cationic reactive modifier should be at least bifunctional.

A chain extension segment having 4 to 80 repeating $C_2$–$C_4$alkoxy groups, for example isopropoxy, propoxy and ethoxy, is most preferred.

Depending on the polarity of the composition, the chain extension segment can be chosen in such a way that the cationic reactive modifier is highly compatible with the liquid curable composition. Such a selection results in, not only an improvement in elongation and impact resistance, but improved recoatability and elimination of undesirable phase separation phenomena. In the case of slightly polar liquid compositions, the chain extension segment may be an ethoxy or propoxy or isopropoxy or oxytetramethylene or derivatives thereof. In addition to high flexibility, if there is a need for imparting water resistance into the composition, then the aromatic or hydrocarbon or isopropoxy or low ether content chain extenders are most preferred.

The cationic reactive modifiers are preferably present in the overall composition at between about 0.5% to about 60% by weight, more preferably about 2% to about 50% by weight, most preferably about 2% to 30 by weight. The solid or liquid reactive cationically modifiers may be used singly or as a mixture.

The compositions described above can further include customary additives for stereolithographic compositions, such as coloring agents, such as pigments and dyes, antifoaming agents, leveling agents, thickening agents, flame retardant and antioxidants.

In a particularly preferred embodiment, the hybrid cationically and radically cured composition does not contain any polyol or hydroxyl group-containing compounds. It has been widely accepted that hydroxyl group-containing compounds are a required component for epoxy hybrid compositions used in stereolithography. It is believed that epoxy formulations do not cure and postcure to high extent unless the composition contains a certain percentage of a diol, triol or polyol. This belief is based on the understanding that the hydroxyl groups react with the epoxy groups during the epoxy ring opening, and contribute to the formation of a dense three dimensional network. A recent application WO 97/38354 (Oct. 16, 1997) to DSM Corp., Japan Synthetic Rubber Co., Ltd., Japan Fine Coatings Co., Ltd. teaches that a diol or triol or polyol component is necessary to be present in a hybrid liquid composition at a concentration above a critical one in order the cured articles to possess good properties. The same patent teaches that "if the proportion of the polyol component is too low, the aim of developing the photo-curing characteristic can not be achieved and these are cases where a three-dimensional object with sufficient stability in shape and properties can not be produced from the resin composition". Applicants, however, herein have been able to obtain highly crosslinked networks by photopolymerizing hybrid epoxy compositions with no diol or trio or polyol having high heat deflection temperature values, in excess 110° C.

If necessary, the resin composition for stereolithography applications according to the present invention may contain other materials in suitable amounts, as far as the effect of the present invention is not adversely affected. Examples of such materials include radical-polymerizable organic substances other than the aforementioned cationically polymerizable organic substances; heat-sensitive polymerization initiators; various additives for resins such as coloring agents such as pigments and dyes, antifoaming agents, leveling agents, thickening agents, flame retardant and antioxidant; fillers such as silica, alumina, glass powder, ceramic powder, metal powder and modifier resins. Particular examples of the radical-polymerizable organic substances include but not limited to compounds that thermally polymerize, while those of the heat-sensitive polymerization initiator includes aliphatic onium salts disclosed in Japanese Patent Laid-Open Nos. 49613/1982 and 37004/1983.

The filler to be used in the present invention is a reactive or non-reactive, inorganic or organic, powdery, fibrous or flaky material. The filler material can be organic or inorganic. Examples of organic filler materials are polymeric compounds, thermoplastics, core-shell, aramid, kevlar, nylon, crosslinked polystyrene, crosslinked poly(methyl methacrylate), polystyrene or polypropylene, crosslinked polyethylene powder, crosslinked phenolic resin powder, crosslinked urea resin powder, crosslinked melamine resin powder, crosslinked polyester resin powder and crosslinked epoxy resin powder. Examples of inorganic fillers are mica, glass or silica beads, calcium carbonate, barium sulfate, talc, glass or silica bubbles, zirconium silicate, iron oxides, glass fiber, asbestos, diatomaceous earth, dolomite, powdered metals, titanium oxides, pulp powder, kaoline, modified kaolin, hydrated kaolin metallic fillers, ceramics and composites. Mixtures of organic and/or inorganic fillers can be used.

Further examples of preferred fillers are micro crystalline silica, crystalline silica, amorphous silica, alkali alumino silicate, feldspar, woolastonite, alumina, aluminum hydroxide, glass powder, alumina trihydrate, surface treated alumina trihydrate, alumina silicate. Each of the preferred fillers is commercially available. The most preferred filler materials are inorganic fillers, such as mica, Imsil, Novasite, amorphous silica, feldspar, and alumina trihydrate. It has transparency to UV light, low tendency to refract or reflect incident light and it provides good dimensional stability and heat resistance.

The filler to be used for the resin composition for stereolithography according to the present invention must satisfy requirements that it hinders neither cationic nor radical polymerizations and the filled SL composition has a relatively low viscosity suitable for the stereolithography process. These fillers may be used alone or as a mixture of two or more of them depending upon the desired performance. The fillers used in the present invention may be neutral acidic or basic. The filler particle size may vary depending on the application and the desired resin characteristics. It may vary between 50 nanometers and 50 micrometers.

The filler material can optionally be surfaced treated with various compounds-coupling agents. Examples include methacryloxy propyl trimethoxy silane, beta-(3,4-epoxycyclohexyl)ethyl trimethoxy silane, gamma-glycidoxy propyl trimethoxy silane and methyl triethoxy silane. The most preferred coupling agents are commercially available from Osi Chemicals Corp. and other chemical suppliers.

The filler loading is preferably from about 0.5 to about 90%, more preferably from about 5 to about 75%, most preferably from about 5 to about 60% by weight with respect to the total weight of the filled resin composition.

The novel compositions can be prepared in a known manner by, for example, premixing individual components and then mixing these premixes, or by mixing all of the components using customary devices, such as stirred vessels, in the absence of light and, if desired, at slightly elevated temperature.

The novel compositions can be polymerized by irradiation with actinic light, for example by means of electron beams, X-rays, UV or VIS light, preferably with radiation in the wavelength range of 280–650 nm. Particularly suitable are laser beams of HeCd, argon or nitrogen and also metal vapour and NdYAG lasers. This invention is extended throughout the various types of lasers existing or under development that are to be used for the stereolithography process, e.g. solid state, argon ion lasers, etc. The person skilled in the art is aware that it is necessary, for each chosen light source, to select the appropriate photoinitiator and, if appropriate, to carry out sensitization. It has been recognized that the depth of penetration of the radiation into the composition to be polymerized, and also the operating rate, are directly proportional to the absorption coefficient and to the concentration of the photoinitiator. In stereolithography it is preferred to employ those photoinitiators which give rise to the highest number of forming free radicals or cationic particles and which enable the greatest depth of penetration of the radiation into the compositions which are to be polymerized.

The invention additionally relates to a method of producing a cured product, in which compositions as described above are treated with actinic radiation. For example, it is possible in this context to use the novel compositions as adhesives, as coating compositions, as photoresists, for example as solder resists, or for rapid prototyping, but especially for stereolithography. When the novel mixtures are employed as coating compositions, the resulting coatings on wood, paper, metal, ceramic or other surfaces are clear and hard. The coating thickness may vary greatly and can for instance be from 0.01 mm to about 1 mm. Using the novel mixtures it is possible to produce relief images for printed circuits or printing plates directly by irradiation of the mixtures, for example by means of a computer-controlled laser beam of appropriate wavelength or employing a photomask and an appropriate light source.

One specific embodiment of the abovementioned method is a process for the stereolithographic production of a three-dimensional shaped article, in which the article is built up from a novel composition with the aid of a repeating, alternating sequence of steps (a) and (b); in step (a), a layer of the composition, one boundary of which is the surface of the composition, is cured with the aid of appropriate radiation within a surface region which corresponds to the desired cross-sectional area of the three-dimensional article to be formed, at the height of this layer, and in step (b) the freshly cured layer is covered with a new layer of the liquid, radiation-curable composition, this sequence of steps (a) and (b) being repeated until an article having the desired shape is formed. In this process, the radiation source used is preferably a laser beam, which with particular preference is computer-controlled.

In general, the above-described initial radiation curing, in the course of which the so-called green models are obtained which do not as yet exhibit adequate strength, is followed then by the final curing of the shaped articles by heating and/or further irradiation.

The term "liquid" in this application is to be equated with "liquid at room temperature" in the absence of any statement to the contrary, room temperature being understood as being, in general, a temperature between 5° and 45° C., preferably between 15° and 30° C.

Examples Background

Representative embodiments of the present invention will be described as examples, though the present invention by no means is limited by them. In the following examples, all parts are by weight. The formulations indicated in the examples are prepared by mixing the components, with a stirrer at 20 to 80° C. (depending on viscosity) until a homogeneous composition is obtained. Most formulations can be stirred to a homogenous composition at room temperatures of about 25 to 30° C.

The physical data relating to the formulations are obtained as follows: The viscosity of the liquid mixture is determined at 30° C. using a Brookfield viscometer. The mechanical properties of the formulations are determined on three-dimensional specimens produced with the aid of an He/Cd or Ar/UV laser. In particular, the window panes (for measuring photospeed) and the HDT specimens were built in a 3D Systems SL 350 sterelithography machine using a solid state laser emitting at 355 nm. The HDT specimens were UV postcured in a 3D PCA apparatus for 90 minutes and subsequently thermally postcured at 160° C. for 2 hours. The HDT value was measured based on the ASTM method D648 under maximum fiber stress of 66 psi.

The photosensitivity of the formulations is determined on so-called window panes. In this determination, single-layer test specimens are produced using different laser energies, and the layer thicknesses obtained are measured. The plotting of the resulting layer thickness on a graph against the logarithm of the irradiation energy used gives a "working curve". The slope of this curve is termed $D_p$ (given in mm or mils). The energy value at which the curve passes through the x-axis is termed $E_c$ (and is the energy at which gelling of the material still just takes place; cf. P. Jacobs, Rapid Prototyping and Manufacturing, Soc. of Manufacturing Engineers, 1992, p. 270 ff.).

The raw materials used for liquid SL compositions of Table 1 were:

Trimethylolpropane triglycidylether (Heloxy 48) and 4,4'-cyclohehanedimethanol diglycidylether (Heloxy 107) are commercial products of Shell Corp., Houston, Tex.

1,4-Butanediol diglycidylether (Araldite DY026), cresol epoxy novolac (ECN1299), epoxy phenol novolac (EPN 9880CH), 3,4-epoxycyclohexylmethyl 3',4'-epoxycyclohexanecarboxylate (Araldite CY179), and radical photoinitiator 1-hydroxycyclohexyl phenyl ketone (Irgacure 184), are all commercial products of Ciba Specialty Chemicals Corp., Tarrytown, N.Y.

3,4-epoxycyclohexylmethyl 3',4'-epoxycyclohexanecarboxylate (UVAcure1500), is a distilled cycloaliphatic diepoxide, and the Bisphenol A diglycidylether diacrylate (Ebecryl 3700) are commercial products of UCB Radcure, Smyrna, Ga.

Dipentaerythritol monohydroxypentaacrylate (SR 399) and the cationic photoinitiator CD1010 are commercial products of Sartomer Corp, Exton, Pa.

Caprolactone polyester-polyol Tone 0301 is a commercial product of Union Carbide, Danbury, Conn.

EXAMPLE 1

TABLE 1

Liquid Stereolithography Compositions.

| | Formula # | | | | | | | |
|---|---|---|---|---|---|---|---|---|
| | 1 | 2 | 3 | 4 | 5 | 6 | 7 | 8 |
| Heloxy 48 | 15.0 | 30.0 | | | 30.0 | 10.0 | 10.0 | 30.0 |
| Heloxy 107 | | | 30.0 | | | 12.5 | 12.5 | |
| DY 026 | | | | 30.0 | | 20.0 | 20.0 | |
| ECN 1299 | | | | | | 38.2 | | |
| EPN 9880 CH | | | | | | | 38.2 | |
| UVACure 1500 | 65.2 | 50.2 | 50.2 | 50.2 | | | | 50.2 |
| CY 179 | | | | | 50.2 | | | |
| Vectomer 4010 | | | | | | | | 8.0 |
| N3700 | 6.3 | 6.3 | 6.3 | 6.3 | 6.3 | 6.3 | 6.3 | 6.3 |
| SR399 | 6.0 | 6.0 | 6.0 | 6.0 | 6.0 | 6.0 | 6.0 | 6.0 |
| I-184 | 2.5 | 2.5 | 2.5 | 2.5 | 2.5 | 2.5 | 2.5 | 2.5 |
| CD 1010 | 5.0 | 5.0 | 5.0 | 5.0 | 5.0 | 4.5 | 4.5 | 5.0 |
| Total Weight | 100.0 | 100.0 | 100.0 | 100.0 | 100.0 | 100.0 | 100.0 | 108.0 |
| $D_p$ (mils) | 5.46 | 5.48 | 5.57 | 5.26 | 5.59 | 4.86 | 4.84 | 5.39 |
| $E_c$ (mJ/cm$^2$) | 8.85 | 8.54 | 7.39 | 6.75 | 10.05 | 14.38 | 21.35 | 6.06 |
| HDT, 2 h at 160° C. | 215 | 254 | 129 | 130 | 141 | 240 | 110 | 208 |

Compositions 1 and 2 produce cured articles having excellent heat deflection temperature values due to the presence of Uvacure 1500, a purified cycloaliphatic epoxide with epoxy equivalent weight between 130 and 145, in conduction with Heloxy 48, a polyglycidylether component having at least three epoxy groups and epoxy equivalent weight between 140 and 160. Composition 3 shows a drop of about 125° C. of the HDT value compared to that of composition 2. This trend was attributed to the replacement of Heloxy 48 of composition 2 with Heloxy 107, a difunctional glycidylether in composition 3; note that Heloxy 48 and Heloxy 107 have very similar epoxy equivalent weight, and are contained at the same percentage by weight. A similar trend was observed in composition 4 where introduction of the Araldite DY 026, a difunctional aliphatic epoxide with epoxy equivalent weight of between 120–135 instead of Heloxy 48 (as in composition 2) may be responsible for lowering the HDT value to about 130° C. Composition 5 is similar to composition 2 except that Uvacure 1500 has been replaced with Araldite CY 179. Araldite CY179 is an alicyclic epoxide having substantially the same chemical structure as UVAcure 1500. Without being bound by any theories, the lower HDT value of composition 5 relative to composition 2 may be attributed to the fact that CY179 has a lower monomer purity than UVAcure1500. Composition 6 produces excellent heat deflection temperature value due to the incorporation of ECN 1299 (epoxy cresol novolac), which has a very high number of reactive functionality (approximately 5.4). Composition 7 containing an epoxy phenol novolac shows HDT value that is higher than the commercially available hybrid stereolithography resins having HDT values between 80 and 100° C. Replacement of the EPN9880CH component (epoxy functionality of 3.6) with another epoxy phenol novolac having epoxy functionality over 4 would yield a cured article with much higher HDT value than composition 7. Composition 8 shows that incorporation of a vinylether, Vectomer 4010, improves the photospeed of the liquid composition while maintaining high thermal resistance.

The above-mentioned scientific comments on SL liquid compositions of Table 1 were provided in an attempt to follow the trend of thermal properties based on individual components. Our intention was neither to distinguish amongst good or bad SL liquid compositions nor to be bound by any theories. In addition to high HDT values, the compositions shown above exhibit high photospeed, good wet-recoatability properties, high water resistance and good side wall finish.

What is claimed is:

1. A novel resin composition comprising:
   a) 55–90% by weight of at least one solid or liquid actinic radiation-curable and cationically polymerizable organic substance;
   b) 0.05 to 10% by weight of an actinic radiation-sensitive initiator for cationic polymerization;
   c) 5% to 25% by weight of an actinic radiation-curable and radical-polymerizable organic substance;
   d) 0.02 to 10% by weight of an actinic radiation-sensitive initiator for radical polymerization; and
   e) 0.5 to about 40 percent by weight of at least one solid or liquid cationic reactive modifier-flexibilizer, wherein the reactive modifier-flexibilizer is a reactive epoxy modifier, reactive vinylether modifier, reactive oxetane modifier, or mixtures thereof, and wherein the reactive modifier-flexibilizer contains at least one chain extension segment with a molecular weight of at least about 100 and not more than 2000, wherein component (a) comprises at least one glycidylether of a polyhydric aliphatic, alicyclic or aromatic alcohol having at least three epoxy groups with epoxy equivalent weight between 90 and 800 g/equivalent and at least one solid or liquid alicyclic epoxide with epoxy equivalent weight between 80 and 330 having at least two epoxy groups with a monomer purity of at least about 80% by weight, or mixtures thereof.

2. A curable composition according to claim 1 wherein the reactive modifier-flexibilizer comprises at least one cationically reactive bifunctional aliphatic, alicyclic or aromatic compound containing a chain extension segment connected to the cationic reactive group with a molecular weight of at least about 100 and not more than 2000.

3. A curable composition according to claim 1 wherein the composition contains about 4 to 30% by weight of a free radically curable component comprising at least 4% by weight of a mono- or di(meth)acrylate and at least 4% by weight of a poly(meth)acrylate having (meth)acrylate functionality greater than or equal to 3.

4. method of producing a cured product, in which a composition according to claim 1 is treated with actinic radiation.

5. A novel resin composition comprising:
   a) 55–90% by weight of at least one solid or liquid actinic radiation-curable and cationically polymerizable organic substance;
   b) 0.05 to 10% by weight of an actinic radiation-sensitive initiator for cationic polymerization;
   c) 5–25% by weight of an actinic radiation-curable and radical-polymerizable organic substance; and
   d) 0.02 to 10% by weight of an actinic radiation-sensitive initiator for radical polymerization,
   wherein component (a) comprises at least one glycidylether of a polyhydric aliphatic, alicyclic or aromatic alcohol having at least three epoxy groups with epoxy equivalent weight between 90 and 800 g/equivalent and at least one solid or epoxy cresol novolac, or epoxy phenol novolac with epoxy equivalent weight between 130 and 350 having at least two functional groups, or mixtures thereof.

6. A curable composition according to claim 5 wherein the at least one glycidylether of a polyhydric aliphatic, alicyclic or aromatic alcohol having at least three epoxy groups is at least 15% by weight of the at least one solid or liquid epoxy cresol novolac, epoxy phenol novolac having at least two functional groups.

7. A curable composition according to claim 5 wherein the at least one solid or liquid epoxy cresol novolac or epoxy phenol novolac having at least two functional groups has an epoxy functionality at least 4.5.

8. A curable composition according to claim 5 wherein the composition further comprises:
   e) 0.5 to about 40 percent by weight of at least one solid or liquid cationic reactive modifier-flexibilizer.

9. A curable composition according to claim 8 wherein the at least one solid or liquid cationic reactive modifier is a reactive epoxy modifier or reactive vinylether modifier or mixtures thereof.

10. A curable composition according to claim 8 wherein the reactive modifier-flexibilizer comprises at least one cationically reactive bifunctional aliphatic, alicyclic or aromatic compound containing a chain extension segment connected to the cationic reactive group with a molecular weight of at least about 100 and not more than 2000.

11. A method of producing a cured product, in which a composition according to claim 5 is treated with actinic radiation.

12. A novel resin composition consisting essentially of:
   a) 55–90% by weight of at least one solid or liquid actinic radiation-curable and cationically polymerizable organic substance;
   b) 0.05 to 10% by weight of an actinic radiation-sensitive initiator for cationic polymerization;
   c) 5% to 25% by weight of an actinic radiation-curable and radical-polymerizable organic substance;
   d) 0.02 to 10% by weight of an actinic radiation-sensitive initiator for radical polymerization; and
   e) 0.5 to about 40 percent by weight of at least one solid or liquid cationic reactive modifier-flexibilizer, wherein the reactive modifier-flexibilizer is a reactive epoxy modifier, reactive vinylether modifier, reactive spiro-orthoester modifier, reactive oxetane modifier, or mixtures thereof, and wherein the reactive modifier-flexibilizer contains at least one chain extension segment with a molecular weight of at least about 100 and not more than 2000,
   wherein component (a) comprises at least one glycidylether of a polyhydric aliphatic, alicyclic or aromatic alcohol having at least three epoxy groups with epoxy equivalent weight between 90 and 800 g/equivalent and at least one solid or liquid alicyclic epoxide with epoxy equivalent weight between 80 and 330 having at least two epoxy groups with a monomer purity of at least about 80% by weight, or mixtures thereof.

13. A curable composition according to claim 1 wherein component (a) comprises an alicyclic epoxide having over about 90% monomer purity.

* * * * *